United States Patent [19]

Onoki et al.

[11] 4,130,672
[45] Dec. 19, 1978

[54] METHOD FOR COATING ANTI-REFLECTION FILM ON SURFACE OF OPTICAL MATERIAL

[75] Inventors: Fumio Onoki, Tokorozawa; Hajime Kamiya, Kokubunji, both of Japan

[73] Assignee: Hoya Lens Co., Ltd., Japan

[21] Appl. No.: 504,977

[22] Filed: Sep. 11, 1974

[30] Foreign Application Priority Data

Oct. 16, 1973 [JP] Japan .................. 48-116117

[51] Int. Cl.² ............................. B05D 5/06
[52] U.S. Cl. .................. 427/164; 350/164; 427/255; 427/248 R; 427/248 J; 427/167
[58] Field of Search ............ 427/167, 255, 402, 166, 427/164; 350/164

[56] References Cited

U.S. PATENT DOCUMENTS

| | | | |
|---|---|---|---|
| 2,745,767 | 5/1956 | Auwärter | 427/167 |
| 3,306,768 | 2/1967 | Peterson | 427/166 |
| 3,356,522 | 12/1967 | Libbert | 427/164 |
| 3,432,225 | 3/1969 | Rock | 350/164 |
| 3,505,092 | 4/1970 | Ryan et al. | 427/167 |
| 3,738,732 | 6/1973 | Ikeda | 350/164 |
| 3,984,581 | 10/1976 | Dobler | 427/164 |

OTHER PUBLICATIONS

"Multilayer Filters," Institute of Optics, The University of Rochester, Summer 1963, pp. 20–16, 28–29.
Concepts of Classical Optics, Applications of Physical Optics by Strong, p. 252, 1958.
"Two-Layer Anti-Reflection Coatings for Glass in the Near Infrared" by Cox et al. from Vacuum, vol. 4, No. 4, pp. 445-455 (1954).

*Primary Examiner*—Ronald H. Smith
*Assistant Examiner*—Sam Silverberg
*Attorney, Agent, or Firm*—Hill, Gross, Simpson, Van Santen, Steadman, Chiara & Simpson

[57] ABSTRACT

A method for coating silicon oxide SiO film and silicon dioxide $SiO_2$ film on the surface of transparent optical material of glass or syntheic resin whose refractive indices are varied by changing the condition of vapor-deposition, under a predetermined condition of vapor-deposition so as to form a firm and durable anti-reflection film.

2 Claims, 3 Drawing Figures

METHOD FOR COATING ANTI-REFLECTION FILM ON SURFACE OF OPTICAL MATERIAL

BACKGROUND OF THE INVENTION

1. Field of the Invention

The present invention relates to a method for coating an anti-reflection film, on the surface of an optical material and more particularly to a method for a vacuum-depositing, on the surface of a transparent optical material of glass or synthetic resin, silicon oxide SiO and silicon dioxide $SiO_2$ whose refractive indices are varied by changing the conditions of the vacuum-deposition, under a predetermined condition of the vacuum-deposition so as to form a firm and durable anti-reflection film.

2. Description of the Prior Art

It is well-known to coat an anti-reflection film on a transparent optical material (hereafter referred to as "substrate" for brevity) through a vacuum-deposition method. For example, a single film of $MgF_2$ was vacuum-deposited as an anti-reflection film on the surface of a substrate. According to the conventional vacuum-deposition method, however, unless the surface of the substrate is cleaned and heated up to temperatures of 150°–350° C. in vacuum to completely remove moisture and organic contamination on the surface, a satisfactory anti-reflection film cannot be formed or the resultant anti-reflection film, even if formed satisfactory fortunately, is very lacking in durability. Moreover, the conventional method is by no means considered satisfactory due to the fact that the heating of the substrate up to temperatures higher than 150° C. usually accompanies a change in the material, and physical deformation and degradation in light transmittivity in the case where a synthetic resin substrate or polarizing substrate of glass layers with a high-molecular film interposed therebetween is used.

SUMMARY OF THE INVENTION

It is therefore the object of the present invention to provide a method capable of easily forming a firm and durable anti-reflection film on a substrate of glass or synthetic resin at temperatures lower than 120° C. at which the light transmittivity, material and shape of the substrate are not adversely affected.

In order to attain the object mentioned above, the present invention utilizes the fact that silicon oxide is easily vacuum-deposited even at a low temperature (100° C.) on the surface of substrate especially of synthetic resin which cannot be heated up to high temperatures and forms a firm and uniform film and that if the vacuum-deposition is performed under a certain condition, $SiO_2$ forms a stable film having a small refractive index while SiO produces a stable film having a large refractive index.

Accordingly, a durable anti-reflection film can be easily obtained by the vacuum-depositing $SiO_2$ and SiO films on the surface of the substrate.

Other objects, features and advantages of the present invention will be apparent when one reads the following detailed description of the preferred embodiments of the invention in conjunction with the accompanying drawings, in which:

DESCRIPTION OF THE PREFERRED EMBODIMENTS

Now, the present invention will be described by way of embodiments, taken in conjunction with the accompanying drawings.

Figure 1:
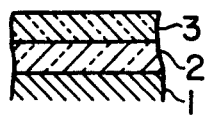
FIG. 1 shows in cross section on magnified scale an anti-reflection film consisting of two layers, coated according to the present invention.

Reference should first be had to FIG. 1. A substrate 1 placed in a vacuum chamber kept at high vacuum of $5 \times 10^{-5}$–$8 \times 10^{-6}$ Torr is heated up to temperatures of 20°–120° C. and silicon oxide SiO is vacuum-deposited at a speed of 50–150 nm/min. on the surface of the substrate 1 up to a thickness of ($\frac{1}{4}$) of ($\frac{1}{4}$) $\lambda$ (wavelength $\lambda = 500$–550 nm), so that a thin film 2 having a large refractive index (nd = 1.52–1.80) is obtained.

Next, the degree of vacuum in the vacuum chamber in which the substrate 1 is kept at temperatures of 20°–120° C. is increased up to $2 \times 10^{-4}$–$7 \times 10^{-5}$ Torr and silicon dioxide $SiO_2$ is vacuum-deposited at a speed of 15–40 nm/min. on the thin film 2 up to a thickness of $\lambda/4$ ($\lambda = 500$–550 nm), so that a thin film 3 having a small refractive index (nd = 1.46) is obtained. Thus, an anti-reflection film consisting of thin films 2 and 3 is formed on the surface of the substrate 1. It should be noted here that the thin film 2 or the thin film 3 alone cannot serve as an anti-reflection film but that only the superposed thin films 2 and 3 having different refractive indices can play an effective role of the anti-reflection film.

Figure 2:
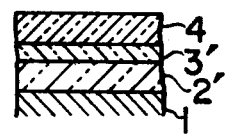
FIG. 2 shows in cross section on magnified scale an anti-reflection film consisting of three layers, coated according to the present invention.

Reference is made to FIG. 2. A substrate 1 placed in a vacuum chamber kept at high vacuum of $2 \times 10^{-4}$–$7 \times 10^{-5}$ Torr is heated up to and kept at temperatures of 20°–120° C. and silicon dioxide $SiO_2$ is vacuum-deposited at a speed of 15–40 nm/min. on the surface of the substrate 1 up to a thickness of $(2.14/4)\lambda$ (190 nm) ($\lambda = 500$–550 nm), so that a thin film 2' having a small refractive index (nd = 1.46) is formed. Then, the degree of vacuum in the vacuum chamber in which the substrate 1 is kept at the temperatures of 20°–120° C. is increased up to $5 \times 10^{-5}$–$8 \times 10^{-6}$ Torr and silicon oxide SiO is vacuum-deposited at a speed of 50–150 nm/min. on the thin film 2' up to a thickness of $(0.27/4)\lambda$ (20 nm) ($\lambda = 500$–550 nm), so that a thin film 3' having a large refractive index (nd = 1.52–1.80) is formed. Finally, silicon dioxide $SiO_2$ is vacuum-deposited on the thin film 3' up to a thickness of $(2.1/4)\lambda$ (190 nm) ($\lambda = 500$–550 nm) under the same conditions of evaporation as in the formation of the thin film 2', to form a thin film 4 having a small refractive index (nd = 1.46). In ths way, an effective anti-reflection film can be obtained.

As described above, the vacuum-deposition is performed with the substrate kept at low temperatures and the changes in the light transmittivity, material and shape of the substrate are not caused at all. Moreover, since SiO and $SiO_2$ both form film and durable thin films on the surface of the substrate, a firm and durable anti-reflection film having any desired effect can be obtained by choosing a suitable combination of SiO and $SiO_2$ thin films.

Now, the embodiments will be described.

EMBODIMENT 1

A substrate of thermosetting synthetic resin such as diethylene glycol bisallyl carbonate (produced under trade name CR-39 by Pittsburgh Plate Glass Company, Chemical Division)

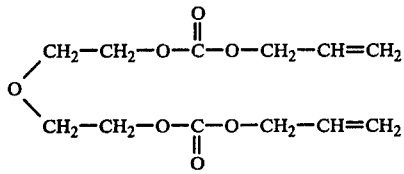

which is placed in a vacuum chamber kept at high vacuum of $2 \times 10^{-5}$ Torr, is heated up to and kept at a temperature of 80° C. and silicon oxide SiO is vacuum-deposited at a speed of 130 nm/min. on the substrate to form a film having a thickness of $\lambda/4$ (wavelength $\lambda = 530$ nm). Then, a small amount of oxygen is added into the vacuum chamber to reduce the degree of vacuum in the chamber to $7 \times 10^{-5}$ Torr while the substrate is kept at the temperature of 80° C. and silicon dioxide $SiO_2$ is vacuum-deposited at a speed of 30 nm/min. on the SiO film to form a film having a thickness of $\lambda/4$ (wavelength $\lambda = 530$ nm).

Figure 3:
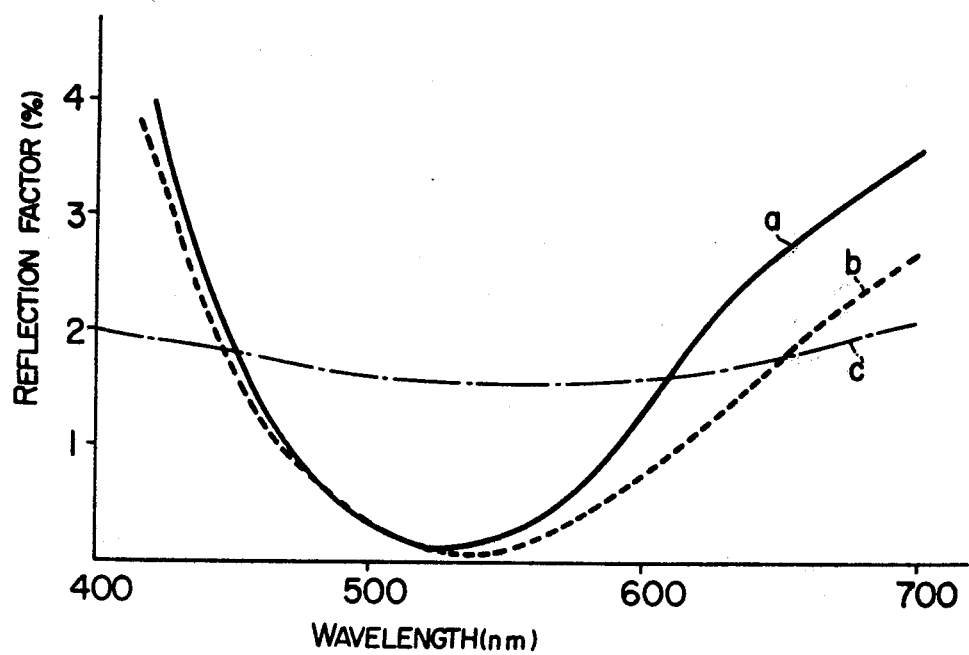
FIG. 3 comparatively illustrates in graphical representation the effects of the anti-reflection film coated according to the present invention and the conventional anti-reflection film.

The thus coated anti-reflection film has an effect represented by the curve a in FIG. 3, in which the light transmittivity is very high, i.e. 99.5%, for a wavelength of 530 nm, and it is seen from FIG. 3 that the effect represented by the curve a is much better than that represented by the curve c associated with an anti-reflection film which is formed according to the conventional method wherein $MgF_2$ is vacuum-deposited on a substrate kept at temperatures of 150°-350° C. to form a thin film.

The anti-reflection film coated of SiO and $SiO_2$ in the above described manner has a hardness of 6–7H in terms of pencil hardness and this hardness is twice as large as that of the Cr-39 substrate. The anti-reflection film has three times as large a hardness as the CR-39 substrate against abrasion by a rubber eraser. On the other hand, the conventional anti-reflection film of $MgF_2$ has a weak adhesiveness and its surface hardness is very low, that is, lower than HB in terms of pencil hardness and its hardness against abrasion is less than a tenth of that of the anti-reflection film coated according to the present invention.

EMBODIMENT 2

A CR-39 substrate placed in a vacuum chamber kept at $7 \times 10^{-5}$ Torr is heated up to a temperature of 80° C. and silicon dioxide $SiO_2$ is vacuum-deposited at a speed of 30 nm/min. on the surface of the substrate to form a film having a thickness of $(2.1/4)\lambda$ (wavelength $\lambda = 530$ nm). Then, the degree of vacuum in the vacuum chamber is increased to $2 \times 10^{-5}$ Torr while the CR-39 substrate is kept at the temperature of 80° C. and silicon oxide SiO is vacuum-deposited at a speed of 130 nm/min. on the $SiO_2$ film to form a film having a thickness of $(0.27/4) \lambda$ ($\lambda = 530$ nm). Finally, the degree of vacuum in the vacuum chamber is decreased to $7 \times 10^{-5}$ Torr while the CR-39 substrate is kept at the temperature of 80° C. and silicon dioxide $SiO_2$ is vacuum-deposited at a speed of 30 nm/min. on the SiO film to form a film having a thickness of $(2.1/4)\lambda$.

The thus coated triple-layer anti-reflection film has an effect represented by the curve b in FIG. 3, in which it is seen that the effect represented by the curve b is much better than that represented by the curve c associated with an anti-reflection film which is formed according to the conventional method wherein $MgF_2$ is evaporated in vacuum to vacuum-deposite a thin film on the surface of a substrate kept at temperatures of 150°-350° C. The hardness of the triple-layer anti-reflection film obtained above is very satisfactory similar to the case of the Example 1.

What we claim is:

1. A method for coating an anti-reflection film on the surface of an optical material, comprising
    a first step of vacuum-depositing under a first condition of vacuum-deposited a silicon oxide SiO film having a predetermined thickness on said surface of said optical material while said optical material is placed in a vacuum chamber having a first vacuum degree and kept at temperatures below 120° C. at which the quality and the shape of said material are not changed, and
    a second step of vacuum-depositing under a second condition of vacuum-deposition different from said first condition a silicon dioxide $SiO_2$ film having a predetermined thickness on said SiO film while the temperature of said optical material is kept the same as in said first step but said first vacuum degree is changed to a second vacuum degree different from said first vacuum degree.

2. A method for coating an anti-reflection film on the surface of an optical material, comprising
    a first step of vacuum-depositing at a speed of 50–150 nm/min. a silicon oxide SiO film having a thickness of $\lambda/2$ (wavelength $\lambda = 500$–550 nm) on said surface of said optical material while said material is placed in a vacuum chamber having vacuum degrees of $5 \times 10^{-5}$–$8 \times 10^{-6}$ Torr and kept at temperatures of 20°–120° C., and
    a second step of vacuum-depositing at a speed of 15–40 nm/min. a silicon dioxide $SiO_2$ film having a thickness of $\lambda/4$ ($\lambda = 500$–550 nm) on said SiO film with said temperatures kept the same but said vacuum degrees changed to $2 \times 10^{-4}$–$7 \times 10^{-5}$ Torr.

* * * * *